United States Patent [19]

Dew

[11] 4,029,949

[45] June 14, 1977

[54] SERVO-CONTROLLED MICROSCOPE STAGE

[75] Inventor: Brock S. Dew, Newton, Mass.

[73] Assignee: The Charles Stark Draper Laboratory, Inc., Cambridge, Mass.

[22] Filed: July 8, 1975

[21] Appl. No.: 593,999

[52] U.S. Cl. .......................... 235/151.11; 318/600; 318/605; 318/655

[51] Int. Cl.² .................... G06J 1/00; G05B 19/42; G05B 19/34

[58] Field of Search ......... 74/813 C; 318/600, 605, 318/654, 655; 235/151.11

[56] References Cited

UNITED STATES PATENTS 3,943,343   3/1976   Irie ............................... 235/151.11

*Primary Examiner*—R. Stephen Dildine, Jr.
*Attorney, Agent, or Firm*—Robert F. O'Connell

[57] ABSTRACT

A system for controlling the position of a movable element, such as a microscope slide in one embodiment thereof, which system includes a unique high resolution digital-to-analog converter which converts a digital command signal to an analog servo input command for moving the element along an arcuate path in two orthogonal directions and for moving the element in a third orthogonal direction along a linear path. The unique digital-to-analog converter which would be broadly useful in many different applications includes means responsive to selected combinations of the most significant bits of a digital input signal for supplying equally weighted selected combinations of a reference signal and responsive to selected combinations of the least significant bits thereof for supplying binary weight selected combinations of the reference signal, the equally weighted binary weighted combinations being combined to produce the analog output signal.

9 Claims, 6 Drawing Figures

SERVO-CONTROLLED MICROSCOPE STAGE

INTRODUCTION

This invention relates generally to servo-controlled positioning devices and, more particularly, to a servo-controlled device for positioning a microscope stage in all three axes thereof.

BACKGROUND OF THE INVENTION

It is often desirable to precisely position an object, such as a slide of a microscope stage, in a manner which provides suitable movement thereof at a relatively high rate of speed to precise positions in an accurate and reliable manner. For example, in the application of image processing to the field of automatic cytology, it is desirable to locate and classify particular cell types by moving a slide containing such cells under a microscope at an average rate of about one cell per second with an accuracy equalling or surpassing that of a human technician. The operator should be able to view the cell which is being classified in order to verify performance as well as to make occasional decisions with respect thereto. Use of a mechanical positioning device in a cytological application, for example, may require the slide to be mechanically located to within 10 micrometers.

While conventional stepping motors have been suggested for use in moving the slide along one or more axes, such devices are insufficient to provide the desired high speed movement of the slide across its dimensions. For example, when using step motors which can move at their normal capabilities at rates of 200 microns per second, a 25 mm. slide requires approximately 2 minutes to move thereacross. Even when the capabilities of the step motor drives are increased essentially to their limits, the rate of movement increases only to the extent that a 25 mm. slide, for example, would still require at least 6 seconds to move across the field of the microscope.

However, the high speed requirements of some cytological applications, for example, require speeds which would permit travel across the 25 mm. slide in approximately one-half second, a requirement which does not appear to be within the capabilities of any known stepping motor devices.

BRIEF SUMMARY OF THE INVENTION

This invention provides for such high speed movement with accuracy and reliability by utilizing a high speed servo-controlled motor drive stage for positioning an element, such as a microscope slide, for example. In such case the slide is positioned by rotation about two axes, while motion along a third axis provides for focussing thereof.

In accordance with the invention the rotational positioning about the two axes produces a quasi-linear motion which is entirely adequate for the purpose intended, since the exact spatial relation of the cells is not important. Each of such two axes is driven by a servo unit utilizing a direct drive torque motor, the shaft of which has mounted thereon an electromagnetic resolver. A first servo unit rotates an arm about a first axis of rotation, at the end of which arm is the second axis of rotation which is appropriately driven by a second servo unit. The position command signal for motion about either axis originates as a digital word via an up/down counter, the parallel output of which drives a specially designed digital-to-analog converter which excites one input of the resolver in the servo unit, the other input being excited by the same reference voltage which is used for the digital-to-analog converter. The output of the resolver is demodulated to produce a DC signal and, after appropriate dynamic compensation, is power amplified to drive the direct drive torque motor in the servo unit. Although the servo loop which is thus created is analog in nature, the command therefor is digital. The dynamic compensation is utilized to produce high gain at low frequency so that friction problems do not produce offset errors.

The third axis for providing focus motion is commanded similarly by an appropriate digital signal from a suitable counter which drives a similar digital-to-analog converter, the output signal of which is summed and differenced with a suitable bias signal, the two resulting sum and difference signals being power amplified to drive opposing solenoids which are appropriately coupled to the slide holder for moving the slide holder vertically in accordance therewith.

The invention can be described in more detail with the assistance of the accompanying drawings wherein FIG. 1 depicts a partial block diagram and partial perspective view of one embodiment of the invention showing the servo loops for both axes, as well as the focus motion controller;

Figure 1:
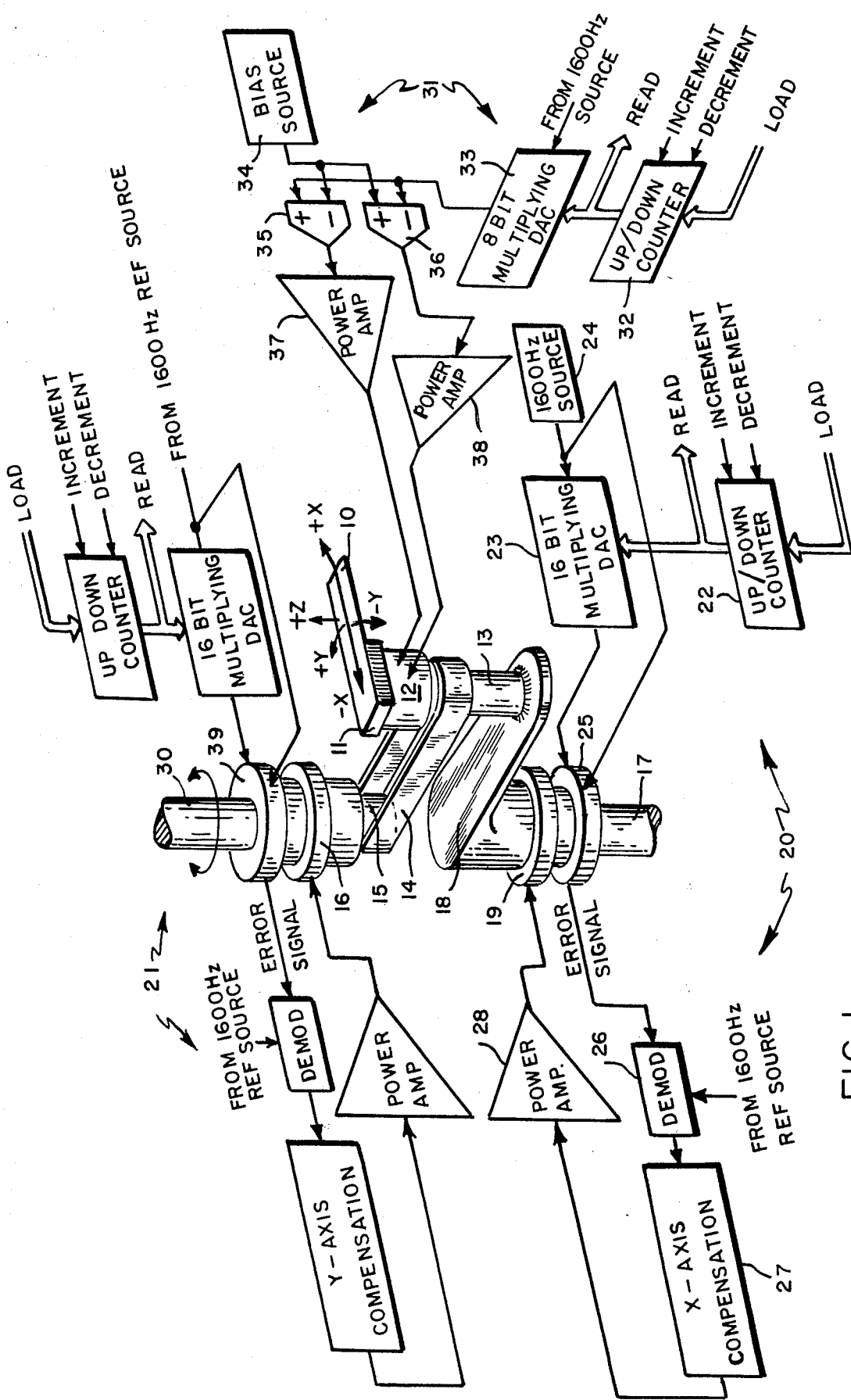

As can be seen in FIG. 1, in one particular embodiment of the invention a microscope slide 10 is mounted at one end thereof to a platform 11 for movement along any one of three axes depicted as the axes X, Y and Z therein. A solenoid drive mechanism 12, described in more detail below, is coupled to the platform 11 for moving such platform in a vertical or ±Z direction. The platform 11 is capable of rotational motion about an axis depicted by shaft 13 via an appropriate belt 14 connected to pulley 15 driven directly by an appropriate DC torque motor 16. The rotational motion about shaft 13 provides rotational motion of the slide along the quasi-linear direction depicted by the arc designated by ±Y. Because the slide 10 is effectively mounted near one end thereof the motion in the ±Y direction is not exactly linear but because of the small motions involved is essentially quasi-linear and effective for the purpose intended.

The slide is similarly rotated along the direction indicated by the arc designated by ±X by rotation of a shaft 17 which motion is coupled to the platform 11 via shaft 13, the latter being fixedly attached at the outer end of an arm 18 the inner end of which is directly connected to shaft 17 which is driven by appropriate DC torque motor 19.

Positioning along the quasi-linear arcs ±X and ±Y is provided by appropriate servo control loops 20 and 21, respectively. Such control loops are substantially similar and the operation of an examplary one will serve to describe the structure and operation of the other. For example, with respect to control loop 20, the position command for rotation about the vertical axis by shaft 17 originates as a digital word from an appropriate up/down counter-register 22 which may be either incremented or decremented and which may be either loaded or read in parallel. For example, in a preferred embodiment of the invention a digital word used for appropriate command positioning may be a 16-bit word, in which case the counter 22 drives a special 16-bit multiplying digital-to-analog converter 23, the specific structure and operation of one embodiment of which is described in more detail below. The digital-to-analog converter has an appropriate AC signal source as its reference voltage source which in a preferred embodiment, for example, may be an AC source 24 providing a reference voltage signal of 1600 Hz. The output of digital-to-analog converter 23 excites one input of a resolver 25 positioned on shaft 17, the other input thereof being excited by the same 1600 Hz reference voltage signal as shown. The resolver 25 may be of the type exemplifed by Model No. SSH-23 B-6 manufactured by Clifton Precision Products, Litton Systems, Inc., Clifton, N.J.

The output of the resolver is in effect an error signal and, being an AC signal, is appropriately demodulated at demodulator 26 so that it can be effectively converted to a direct current signal, the demodulator also being supplied with the same 1600 Hz reference voltage from source 24. The demodulated signal is dynamically compensated by a compensation circuit 27 which may comprise any suitable circuit for providing relatively high gain at relatively low frequencies so that friction present in the mechanically moving parts of the system does not produce offset errors. After dynamic compensation the signal is fed to a power amplifier 28 the output of which drives the servo motor 19.

Thus, the servo loop is, in effect, an analog, or continuous, signal system which is supplied by a digital position command signal. The bandwidth of the loop in the embodiment described in FIG. 1 is approximately 100 Hz and, therefore, step rates below 100 Hz are followed in a step fashion while at rates much above such value the servo system causes the shaft 17 to rotate in a slewed fashion to follow the average commanded position in a relatively smooth manner. The servo control system 21 for driving torque motor 16 to control the rotation of shaft 30 on which is mounted resolver 39, in turn controls the rotation of shaft 13 via pulley 15 and steel band belt 14 is substantially the same, as can also be seen in FIG. 1.

A further position driving system 31 for moving the platform 11 in a vertical direction along the Z axis is also shown in FIG. 1. The latter system includes a suitable up/down counter 32 which can be parallel loaded and parallel read and can be incremented or decremented as desired to provide a digital position command signal. The counter drives a digital-to-analog converter 33 of the same general type as converter 23 and, in this particular embodiment, can be, for example, an 8-bit converter. The output of the converter 33 is added to and subtracted from a voltage from a bias source 34 in comparator circuits 35 and 36, respectively, the outputs of the latter circuits being fed to appropriate power amplifiers 37 and 38, respectively, for driving opposing solenoids of a solenoid positioning device 12.

Figure 2:
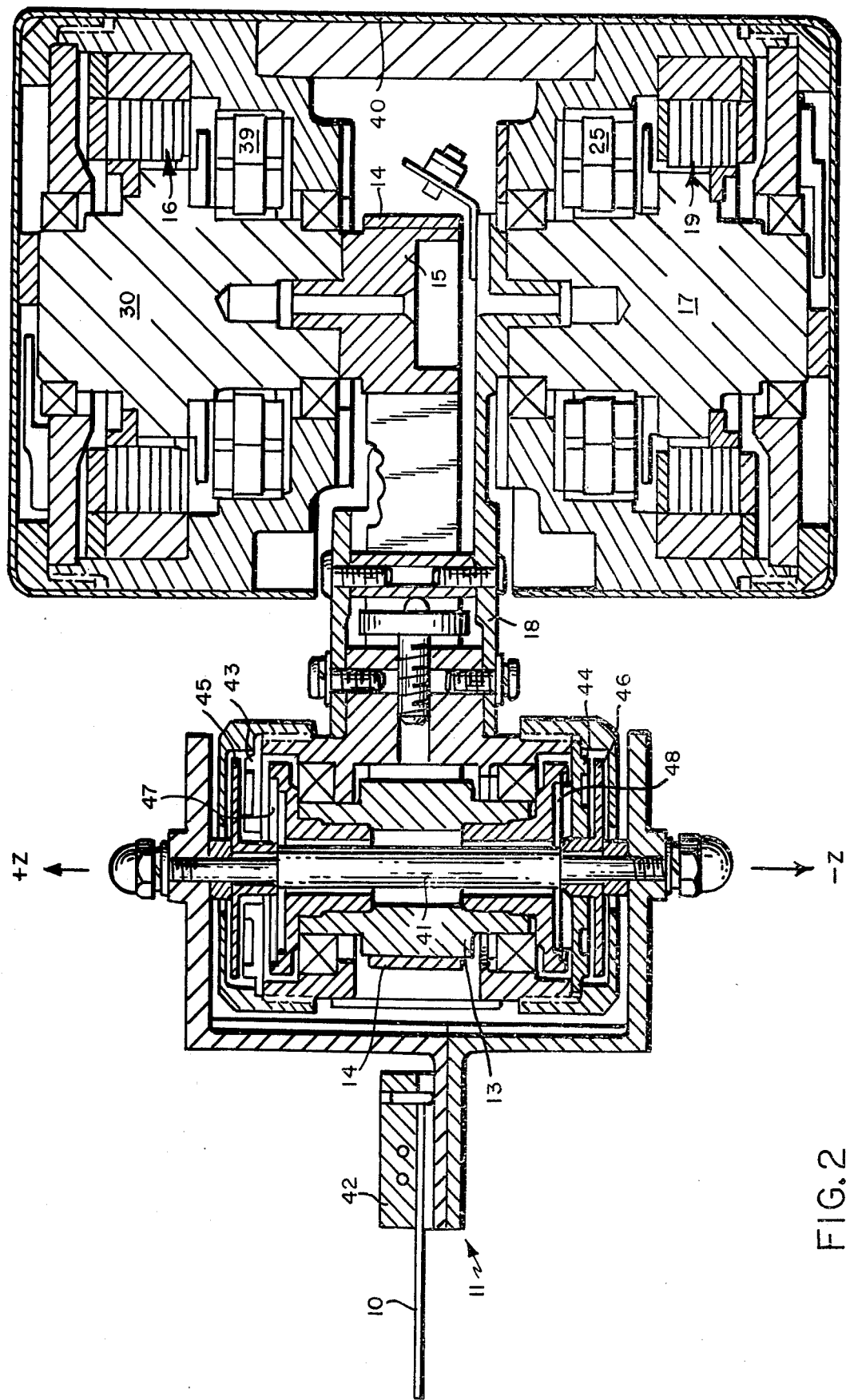
FIG. 2 shows a view in cross section of the mechanical elements of the embodiment of the invention of FIG. 1.

The physical structure of the resolver, motor and solenoid devices is shown best in FIG. 2 which represents an exemplary embodiment of the physical structure of the mechanical elements therein. Thus, as can be seen in FIG. 2, the mechanical portions of the two identical servo control units 20 and 21 are mounted within a suitable housing 40, including torque motors 19 and 16 and resolvers 25 and 39 on shaft members 30 and 17, respectively. Shaft 13 is rotated via belt 14 and pulley 15 and provides movement in the ±X direction. Torque motors 16 and 19 each may be of the type exemplified by Model No. D2910-A-1 manufactured by Clifton Precision Products, Litton Systems, Inc., Clifton, N.J.

Shaft 13 driven by belt 14 and pulley 15 is mounted at the end of arm 18 and includes therein a concentrically mounted focus shaft 41 for moving the platform 11 on which the slide 10 is mounted at one end thereof via slide holder 42. Platform 11 is supported by two spring disks 47 and 48 which also transmit the rotational torque from the pulley. A pair of solenoids 43 and 44 are fixedly attached to arm 18 and pull in opposing directions on associated solenoid armatures 45 and 46, respectively, which are in turn fixedly attached to slide holder 11 via shaft 41. When the bipolar output from digital-to-analog converter 33 is zero, for example, the bias signals from comparator networks 35 and 36 (FIG. 1) cause equal and opposing forces to be produced by the solenoids, resulting in a zero net force against the spring disk restraints. When the output of counter 32 causes the output of converter 33 to swing either positively or negatively, the solenoid forces are increased or decreased in opposite directions, respectively, to cause a movement of the slide holder in one or the other of the vertical directions indicated as ±Z in FIG. 2. Although the forces produced by each solenoid are proportional to the square of the current, the nonlinear effects cancel. The force which is applied thereto is, in effect, a linear force which produces a linear movement of the slide holder along the Z axis. As can be seen therein the slide is effectively gripped from one end thereof and is referenced to the top surface at one edge and one end as shown.

Figure 3:
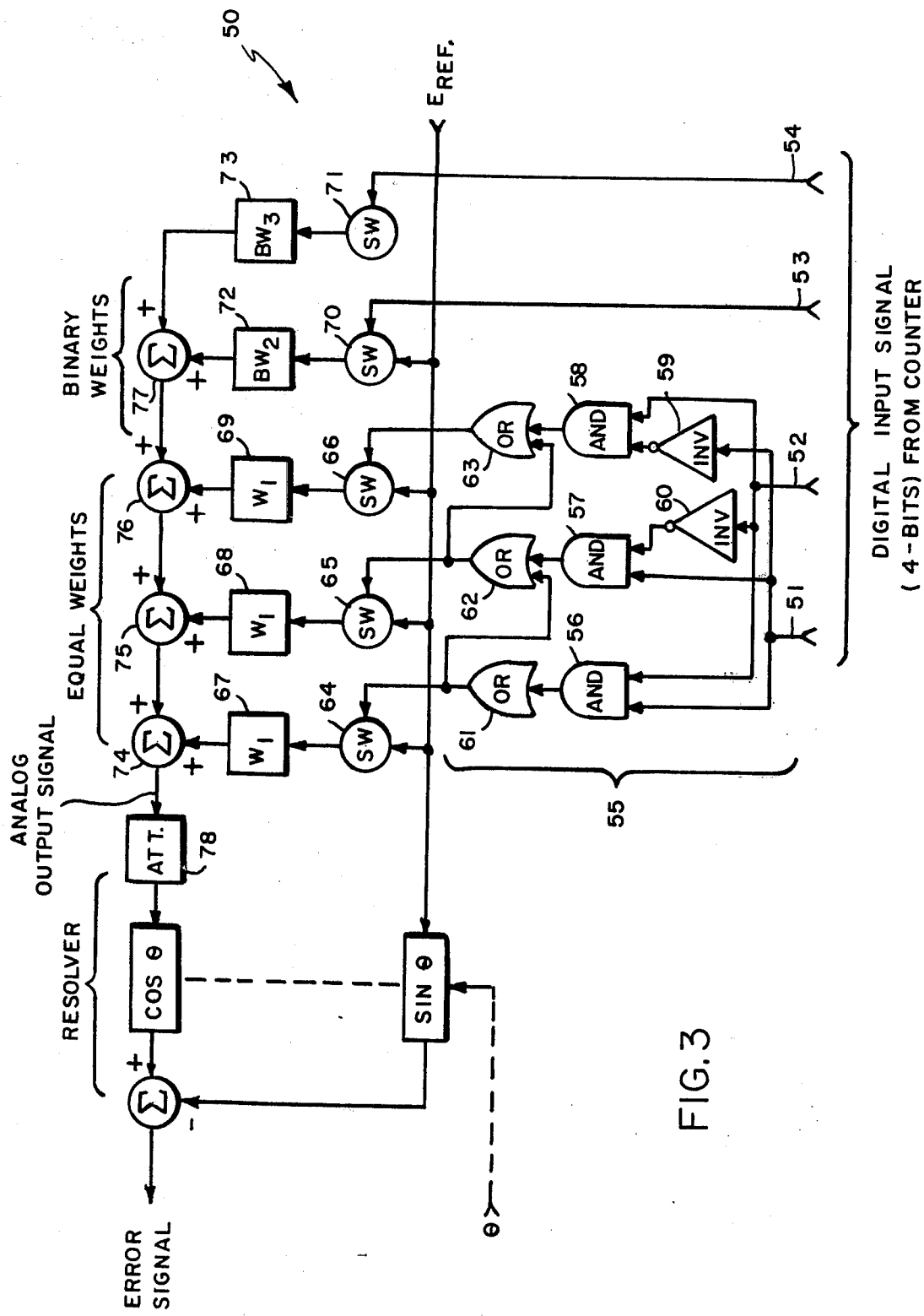
FIG. 3 shows in block diagram form a simplified embodiment of a digital-to-analog converter of the type used in the embodiment of FIG. 1.

While the operation of the digital-to-analog converters of the servo control system may, in a preferred embodiment, such as shown in FIG. 1, require a 16-bit command signal, the principles of the structure and operation of such converters can be most easily illustrated and described with reference to a simplified version thereof which is depicted as having a 4-bit command input, as shown in FIG. 3. The general principles of operation thereof as described below are, therefore, applicable to 16-bit commands as well.

Such a structure can be contrasted with conventional digital-to-analog converters which consist of a series of binary weighted resistors which are switched between one of two reference signals in accordance with a digital input signal, as described, for example, in the text, "Electronic Analog/Digital Conversions", Hermann Schmid, Van Nostrand Reinhold Corp., 1970.

In such conventional converters, at several points in the range, especially at the half-way point, most of the lower order resistors are switching one way while a few higher order resistors are switching the other way. The net result of this transition is a one-bit change in the output voltage. In order to achieve this operation the resistors in conventional converters must be very carefully matched, particularly those providing the weighting for the most significant bits of the input signal. A mismatch therein will produce undesirable errors at the major transition points which have a cumulative effect over the range of analog output levels of the converters.

In accordance with the digital-to-analog converter approach used in the present invention, however, the need for such carefully matched resistors is reduced. As seen in FIG. 3, for example, a 4-bit input word is fed in parallel, the least significant bits being fed, for example, to binary weighted networks while the most significant bits thereof are fed through appropriate decoding logic to a plurality of equally weighted stages. The use of equal weights for a selected number of most significant bits reduces the overall contribution to possible errors significantly. For the 4-bit example described, two binary weights are provided for the two least significant bits and three equal weights are provided for the decoded two most significant bits, as shown.

As can be seen in FIG. 3 a 4-bit input word, comprising two most significant bits 51 and 52 and two least significant bits 53 and 54, is supplied in parallel to the digital-to-analog converter 50. The two most significant bits are supplied to a decoder circuit 55. The most significant bit 51 is supplied directly to AND gates 56 and 57 and to AND gate 58 via inverter 59 and the next most significant bit 52 is supplied directly to AND gates 56 and 58 and to AND gate 57 via inverter 60. The outputs of AND gates 56, 57 are in turn fed to OR gates 61, 62 and 63, respectively, the output of OR gate 61 being supplied as an input to OR gate 62 and the output of OR gate 62 being supplied as an input to OR gate 63.

In effect decoding circuitry 55 produces appropriate combinations of output switching signals for each of the three non-zero states of the two most significant bits 51 and 52. The switching signals are applied to the switch elements 64, 65 and 66, respectively, for switching the reference signal, $E_{REF}$, to the three weighting networks 67, 68 and 69 which provide equal weighting factors $W_1$ for the reference signal. Thus, when the two most significant bits 51 and 52 are both in their zero state (00) none of the switches is activated, when bit 52 only is non-zero (01) switch 66 is activated, when bit 51 only is non-zero (10) switches 65 and 66 are activated, and when both bits 51 and 52 are non-zero (11) all three switches 64, 65 and 66 are activated. In all three non-zero states of the most significant bits 51 and 52 the reference voltage in each case is multiplied by the $W_1$ weight factor and the summation thereof is determined by the selected combinations of the equal weights 67, 68 and 69 provided by the combinations of switches 64, 65 and 66 which are activated. The net effect is that as the input number increases monotonically, the equal weighted resistors are activated one at a time, and never deactivated.

The two least significant bits 53 and 54 each activate switches 70 and 71 directly in their non-zero states for multiplying the reference signal by appropriate binary weights $BW_1$ and $BW_2$ at weighting networks 72 and 73, as in a conventional digital-to-analog converter. The outputs of each of the weighting networks 67, 68, 69, 72 and 73 are supplied to appropriate summing networks 74, 75, 76 and 77, respectively, to provide the desired analog output signal. In such a scheme it is found that the need for critical matching of resistors for the weighting networks is reduced considerably from that required when binary weighting networks only are utilized for all input bits.

In the application of the digital-to-analog converter shown in FIG. 3 for use in the context of FIG. 1, the converter output is supplied to a resolver for providing the two output components shown therein which are dependent on the angular position $\theta$ (i.e., the sin $\theta$ and cos $\theta$ components), the summation of which in the resolver provides the error signal output. In accordance therewith the output of the summation networks 74–77 (which, in effect, is the weighted reference signal) is supplied to the resolver to produce the cos $\theta$ component thereof and the reference signal itself is supplied to the resolver to produce the sin $\theta$ thereof. Thus, the analog resolver output is determined by the ratio of the weighted reference signal to the unweighted reference signal. Accordingly, changes in the reference signal do not effect any overall changes in the resolver signal since such changes affect both the unweighted reference signal and the weighted reference in the same way, the ratio thereof remaining unchanged so that no overall error results. The attenuator 78 provides a scale factor multiplication which is selected to provide a control for the overall range of movement of the axis in response to the digital input command signal.

Figure 4:
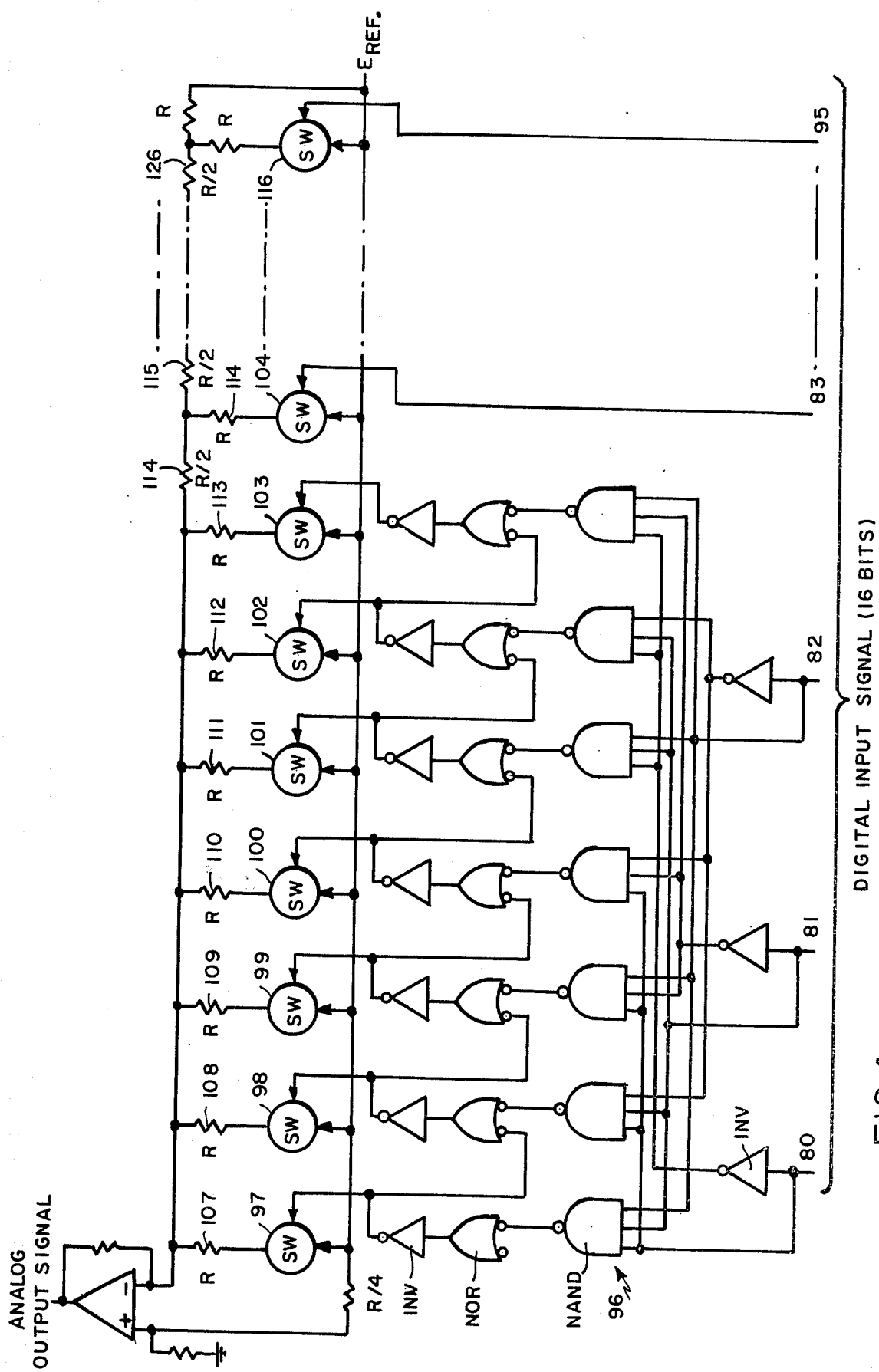
FIG. 4 shows in block diagram form a digital-to-analog converter of the type shown in FIG. 3 in a form applicable to a 16-bit input signal.

A preferred embodiment of the digital-to-analog converter which is extended to a 16-bit input signal is shown in FIG. 4 wherein the first three most-significant bits 80, 81 and 82 are supplied to decoding logic 96 the outputs of which in turn operate switches 97–103 for the seven non-zero states of bits 80–82. Such switched outputs are appropriately weighted by equal weighted resistors 107–113. The remaining thirteen less significant input bits 83–95 are directly supplied to switches 104–116, the outputs thereof being binary weighted by weighting networks 114–126, as shown.

By replacing the upper order binary weighted resistors in a conventional digital-to-analog converter by resistors of lesser, but equal, weight as shown by the resistors 67–69 of FIG. 3 and 107–113 of FIG. 4 the matching thereof is less critical. As the digital number increases monotonically, the equal weighted resistors are switched one at a time and do not change after that. Thus, the effect of switching large resistors at critical points is greatly reduced. While, because of the use of equal weights for the upper order resistors, the output may no longer be perfectly linear or accurate, in a great many applications, such as in the application of moving microscope slides in cytology as described above, such absolute accuracy is not so important. What is more important in such cases is the desire to provide a known and accurate incremental movement about a point rather than an exact relationship between distant points.

Figure 5:
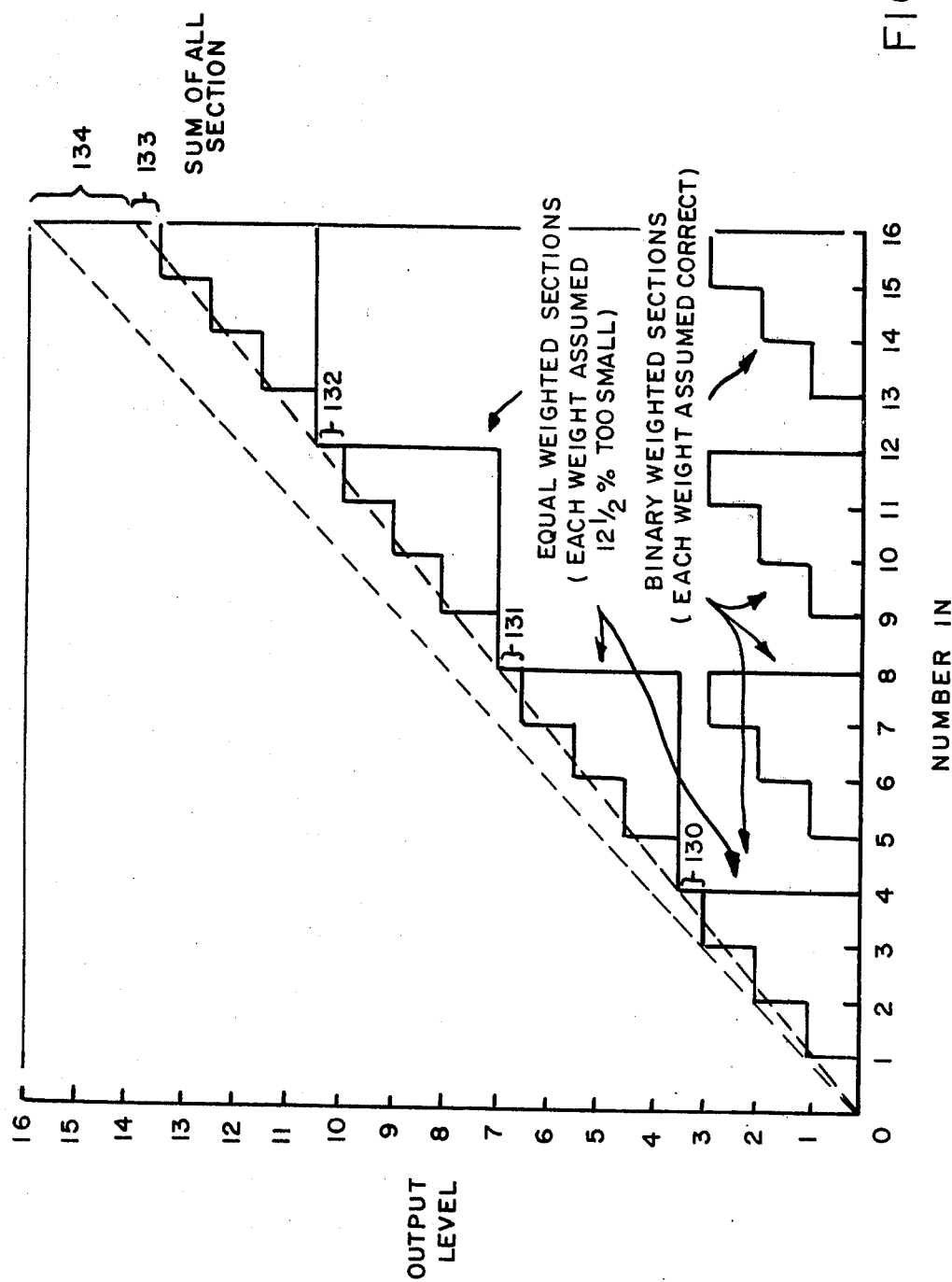
FIG. 5 shows in graphical form the analog output of the converter of FIG. 3 as a function of the digital input thereto.

The operation of the digital-to-analog converter of FIG. 3 (or FIG. 4) provides such incremental accuracy as is illustrated in the graphical presentation of FIG. 5 wherein the 4-bit input system of FIG. 3 produces one of sixteen output levels in response to one of 16 input numbers. In the graphical presentation of FIG. 5, it has been assumed that each weight in the equal weighted section is 12½% too small, while each weight in the binary weighted sections is correct. In such situation there is a ½ bit incremental error (designated as 130, 131, 132 and 133, respectively) for each group of four numbers which results in a total 2-bit error designated by 134. Thus, while the absolute position may be in error by two bits, the incremental error over any four numbers is only ½ bit.

There are several advantages of the system of the invention over the operation provided by prior known step motor driven positioning devices. Thus, in accordance with the invention relatively high slew rates combined with high resolution is provided. There is no gear wear or backlash problems as would occur with step motors. The focussing system has an integral high bandwidth focus motion. The system provides for absolute position encoding and can make use of a parallel computer interface for providing flexible command rates. The physical structure permits easy access to the slide for possible automatic slide changing.

Figure 6:
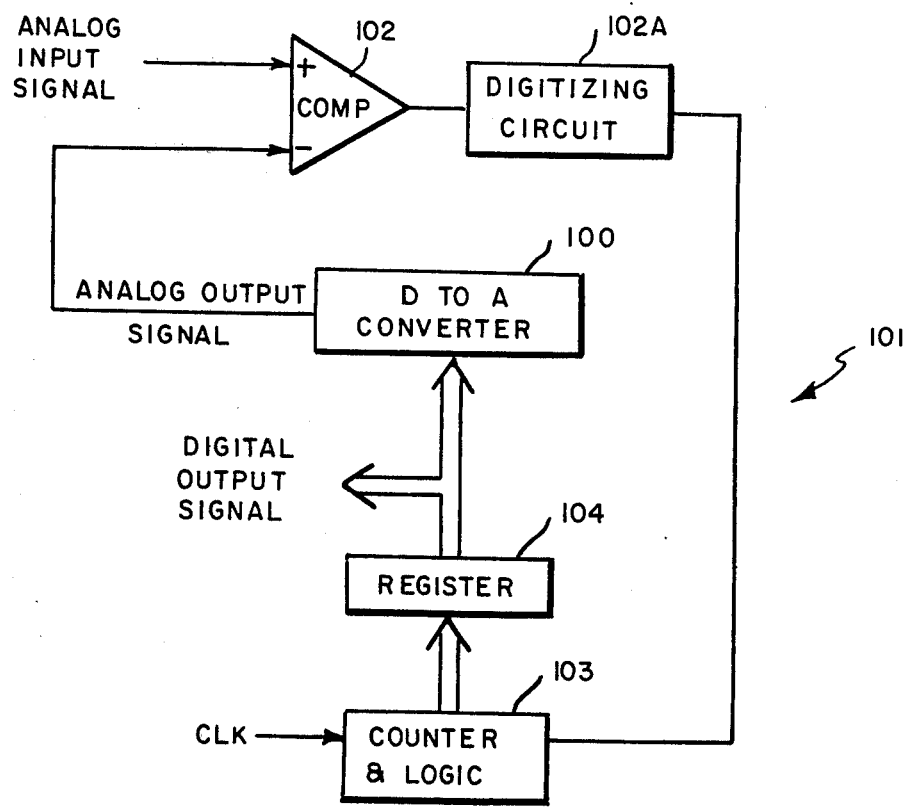
FIG. 6 shows in block diagram form an examplary use of the digital-to-analog converter of the type shown in FIG. 5 for providing analog-to-digital conversion operation.

The digital-to-analog converter as described above can also be used for analog-to-digital conversion as shown in FIG. 6. As seen therein, a digital-to-analog converter 100, of the type shown in FIGS. 3 or 5, is placed in an appropriate loop circuit 101 for converting an analog input signal to a corresponding digital output signal. In accordance therewith the analog output signal from converter 100 is compared with the analog input signal at a signal comparator circuit 102 to produce therefrom a difference signal. Appropriate logic is used to provide a digital input to converter 100 so as to drive the difference signal to zero. Thus, as in conventionally known loop systems used for such purpose, the logic may be such as to provide for successive approximations of the digital input to converter 100 until the difference signal approaches zero.

In the specific embodiment shown in FIG. 6, for example, the comparator 102 and digitizing circuit 102A are such as to produce a digitized signal having one of two states (i.e., ±1) depending on whether the difference signal is greater than or less than zero, (i.e., whether the analog input signal is greater than or less than the analog signal from converter 100.) The digitized signal is fed to a suitable counter and logic circuit 103, clocked by a suitable clock signal, to change the input to a register 104 so as to provide a digital output signal which is used as the parallel fed digital input signal to converter 100. When the difference signal approaches zero (the analog output signal from converter 100 is substantially equal to the analog input signal), the digital signal at the output of register 104 is the digital output signal representation of the analog input signal to comparator 102. Other well known methods for providing appropriate loop operation to produce the same result are known in the art, which when using the digital-to-analog converter of the invention will provide analog-to-digital conversion which will provide the advantages discussed above with respect thereto.

What is claimed is:
1. An apparatus for controlling the position of a movable element comprising
   means for holding said movable element, said holding means being capable of movement in at least two substantially orthogonal directions;
   first and second positioning means for moving said holding means along first and second ones of said at least two orthogonal directions, respectively, each of said first and second means comprising
      means for supplying a digital command signal representing a selected position along an arcuate path substantially corresponding to one of said at least two orthogonal directions;
      means for providing a reference signal;
      a high resolution digital-to-analog converter means responsive to said digital position command signal and to said reference signal for converting said digital position command signal to an analog position command signal, and
      servo control means responsive to said analog position command signal and to said reference signal for directly moving said holding means along said arcuate path to said selected position.

2. An apparatus in accordance with claim 1 wherein said movable element is a microscope slide in a microscope system; and
   said holding means includes means for holding said microscope slide substantially at one end thereof.

3. An apparatus in accordance with claim 2 wherein said servo control means of first and second positioning means each includes
   rotating means for providing movement of said holding means along one of said at least two orthogonal directions;
   resolver means mounted on said rotating means and responsive to said analog position command signal and to said reference signal for producing an a-c error signal;
   demodulation means responsive to said error signal for providing a d-c error signal;
   d-c servo motor means responsive to said d-c error signal for providing rotation of said rotating means in a direction so as to drive said error signal toward zero
   whereby said rotating means provides movement of said holding means such that said microscope slide reaches said selected position along said one of said at least two orthogonal directions.

4. An apparatus in accordance with claim 3 wherein said servo control means of said first and second positioning means each further includes
   compensation means for dynamically compensating said d-c error signal to prevent stand-off errors in the positioning of said microscope slide due to friction present in said rotating means.

5. An apparatus in accordance with claim 4 wherein said servo control means of said first and second positioning means each further includes power amplifier means responsive to said compensation means for driving said d-c servo motor means.

6. An apparatus in accordance with claim 1 and further including
   third positioning means for moving said holding means along a linear path corresponding to a third one of said at least two orthogonal directions, said third means comprising
      means for supplying a digital position command signal representing a selected position along a straight line corresponding to said third orthogonal direction;
      a high resolution converter means responsive to said digital position command signal for converting said digital position command signal to an analog position command signal; and
      means responsive to said analog position command signal for moving said holding means along said straight line to said selected position.

7. An apparatus in accordance with claim 6 wherein said movable element is a microscope slide in a microscope system;

said holding means includes means for holding said microscope slide substantially at one end thereof; and said third positioning means for moving said microscope slide along said linear path produces a focussing effect therefor.

8. An apparatus in accordance with claim 7 wherein said moving means of said third position means includes means for supplying a bias reference signal;

comparator means responsive to said bias reference signal and to said analog position command signal for providing one of a pair of solenoid driver signals; and solenoid means responsive to said pair of solenoid drive signals for moving said holding means along said linear path in a direction dependent upon the relative amplitudes of said bias reference signal and said analog position command signal.

9. An apparatus in accordance with claim 1 wherein high resolution digital to analog converter means includes first means responsive to said reference signal and to selected combinations of a first plurality of the most significant bits of said digital input command signal for supplying a first plurality of equally weighted selected combinations of said reference signal;

second means responsive to said reference signal and to selected combinations of a second plurality of the remaining less significant bits of said digital input command signal for supplying a second plurality of binary weighted selected combinations of said reference signal; and means for combining said first plurality of equally weighted reference signal combinations and said second plurality of binary weighted reference signal combinations to produce an analog position command signal.

* * * * *